United States Patent
Seo et al.

(10) Patent No.: US 6,946,402 B2
(45) Date of Patent: Sep. 20, 2005

(54) FABRICATING METHOD OF POLYCRYSTALLINE SILICON THIN FILM TRANSISTOR WITH IMPROVED ELECTRICAL CHARACTERISTICS

(75) Inventors: Hyun-Sik Seo, Gyeonggi-do (KR); Binn Kim, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 174 days.

(21) Appl. No.: 10/319,636

(22) Filed: Dec. 16, 2002

(65) Prior Publication Data

US 2003/0124779 A1 Jul. 3, 2003

(30) Foreign Application Priority Data

Dec. 27, 2001 (KR) ................................ 10-2001-0086427

(51) Int. Cl.[7] .............................................. H01L 21/461
(52) U.S. Cl. ...................................... 438/754; 438/755
(58) Field of Search .................................. 438/754, 755

(56) References Cited

U.S. PATENT DOCUMENTS 5,879,974 A * 3/1999 Yamazaki ................... 438/162
6,294,441 B1 * 9/2001 Yamazaki ................... 438/486
6,380,007 B1 * 4/2002 Koyama ..................... 438/151
2001/0034088 A1 * 10/2001 Nakamura et al. .......... 438/166

FOREIGN PATENT DOCUMENTS

| JP | 09-107100 | 4/1997 |
|---|---|---|
| JP | 2000-252474 | 9/2000 |

* cited by examiner

*Primary Examiner*—Tranh Nguyen
(74) *Attorney, Agent, or Firm*—Morgan Lewis & Bockius LLP

(57) ABSTRACT

A fabricating method of a polycrystalline silicon thin film transistor includes forming a polycrystalline silicon layer on a substrate having first and second regions through a crystallization process using nickel silicide ($NiSi_x$) as a catalyst, patterning the polycrystalline silicon layer to form an active layer at the first region, leaving a nickel silicide residue at the second region, etching the nickel silicide residue with a solution including hydrofluoric acid (HF) and hydrogen peroxide ($H_2O_2$), forming a gate electrode over the active layer and forming a source and drain in the active layer.

6 Claims, 4 Drawing Sheets

FABRICATING METHOD OF POLYCRYSTALLINE SILICON THIN FILM TRANSISTOR WITH IMPROVED ELECTRICAL CHARACTERISTICS

The present invention claims the benefit of the Korean Patent Application No. 2001-86427 filed in Korea on Dec. 27, 2001, which is hereby incorporated by reference in its entirety.

BACKGROUND OF THE INVENTION

1. Field of the Invention

The present invention relates to a liquid crystal display device, and more particularly, to a fabricating method of a poly crystalline thin film transistor that is used as a switching element of a liquid crystal display device.

2. Discussion of the Related Art

In the field of flat panel display (FPD), active matrix liquid crystal display (AMLCD) devices are widely used. In the LCD devices, a thin film transistor (TFT) is used as a switching element that manipulates the light transmittance of a pixel region by adjusting a voltage applied to a liquid crystal layer of the pixel region. These LCD devices are referred to as thin film transistor liquid crystal display (TFT-LCD) devices. Hydrogenated amorphous silicon (a-Si:H) is an easy material to be fabricated on a large area substrate with high productivity. Moreover, since the hydrogenated amorphous silicon is deposited at a temperature less than about 350° C., a substrate of low cost can be used. Therefore, the hydrogenated amorphous silicon is mainly used in the switching element, which is referred to as an amorphous silicon thin film transistor (a-Si TFT).

However, since the hydrogenated amorphous silicon has a disordered atomic arrangement in that weak silicon-silicon (Si—Si) bonds and dangling bonds exist in the hydrogenated amorphous silicon. These types of bonds become metastable when light or an electric field is applied to the hydrogenated amorphous silicon. As a result, this metastability makes the TFT unstable. Electrical characteristics of the hydrogenated amorphous silicon are especially degraded due to light irradiation. Further, a TFT using the hydrogenated amorphous silicon is hard to use in a driving circuit due to degraded electric characteristics such as a low field effect mobility between about 0.1 cm$^2$/Vsec to about 1.0 cm$^2$/Vsec, and poor reliability. Accordingly, the substrate including the a-Si TFT is connected with a printed circuit board (PCB) using a tape carrier package (TCP) that includes driving integrated circuit (IC). The driving IC and its packaging increase the production cost of an LCD device. Additionally, as the resolution of a liquid crystal panel for an LCD device increases, a pad pitch between gate pads or between data pads of the substrate including the a-Si TFT becomes smaller. Thus, bonding of the TCP and the substrate including the a-Si TFT becomes harder.

To solve these problems, a polycrystalline silicon thin film transistor (p-Si TFT) is suggested. Since a p-Si TFT has a higher field effect mobility than an a-Si TFT, a driving circuit can be simultaneously fabricated on the substrate including the a-Si TFT. Accordingly, the production cost can be reduced and the TCP is no longer needed. Moreover, p-Si TFT can be used as a switching element of a high-resolution panel to use the high field effect mobility of the polycrystalline silicon. Further, a p-Si TFT has a lower photo current than an a-Si TFT such that the display device can be exposed to a lot of light without substantially degrading electrical characteristics of the p-Si TFT.

A fabricating process of polycrystalline silicon can be classified into a low temperature crystallization process and a high temperature crystallization process. In the high temperature crystallization process, a high cost quartz substrate is required to be used because the process temperature is around 1000° C. that is above a strain temperature of a glass substrate. Moreover, since a polycrystalline silicon thin film fabricated through the high temperature crystallization process has a high surface roughness and a poor crystallinity (e.g., fine grain), a high temperature p-Si TFT has worse electrical characteristics than a low temperature p-Si TFT. Thus, the low temperature crystallization process in which polycrystalline silicon is obtained by crystallizing amorphous silicon at a low temperature has been widely researched and developed. The low temperature p-Si TFT-LCD device is the next generation technology having a better display quality, a higher reliability and a lower power consumption than the high temperature p-Si TFT-LCD.

Recently, among the low temperature crystallization processes, a metal induced crystallization (MIC) method, a metal induced lateral crystallization (MILC) method and a field enhanced metal induced crystallization (FE-MIC) method have been widely used and researched. The FE-MIC method has been highlighted as a crystallization method that can reduce required time and temperature for crystallization by applying a direct current (DC) high voltage to a silicon thin film treated with a catalyst metal.

FIGS. 1A to 1C are schematic perspective views illustrating a related art low temperature crystallization process using nickel (Ni) as a catalyst metal.

As shown in FIG. 1A, after a buffer layer 10 and an amorphous silicon (a-Si) layer 12 are sequentially formed on a substrate 1, a small amount of nickel (Ni) is adsorbed into the amorphous silicon layer 12 using one of deposition, coating and implantation.

The substrate 1 is heated to a temperature of less than about 500° C. and an electric field is simultaneously applied to metal electrodes 13 at both ends of the substrate 1 as shown in FIG. 1B. The small amount of nickel and silicon of the amorphous silicon layer 12 react to form nickel silicide (NiSi$_x$; x=0.5~2) and crystallization is induced by the nickel silicide with effects of the heat and the electric field to thereby transform, the amorphous silicon layer 12 into a polycrystalline silicon layer (not shown).

In FIG. 1C, an active layer 20 is formed using a photo-lithographic process to patterning the polycrystalline silicon layer. For example, a photoresist (PR) pattern (not shown) is formed on the polycrystalline silicon layer through coating, exposure and development of photoresist (PR), and the polycrystalline silicon layer is etched by using the PR pattern as an etching mask, thereby the active layer 20. However, the nickel silicide at an interface between the buffer layer 10 and the active layer 20 remains as a nickel silicide residue 30 even after etching of the polycrystalline silicon layer. The nickel silicide residue 30 degrades the dielectric property of an insulating layer and generates defects along edges of the active layer 20, which degrades a subsequently produced TFT. For example, leakage currents can be generated at side portions of the active layer 20 that source and drain electrodes contact due to the nickel silicide residue 30. Moreover, a step coverage is degraded at an edge portion "A" along the active layer 20 due to the nickel silicide residue 30. The poor step coverage causes process inferiority, such as a lower pattern resolution.

SUMMARY OF THE INVENTION

Accordingly, the present invention is directed to a fabricating method of a polycrystalline silicon thin film transistor that substantially obviates one or more of the problems due to limitations and disadvantages of the related art.

An object of the present invention is to provide a fabricating method for a polycrystalline silicon transistor having improved electric characteristics.

Another object of the present invention is to provide a fabricating method of a thin film transistor having an improved reliability by forming an active layer having an improved step coverage property.

Another object of the present invention is to provide a chemical to eliminate a metal silicide residue that remains on a surface after patterning an active layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a fabricating method of a polycrystalline silicon thin film transistor includes forming a polycrystalline silicon layer on a substrate having first and second regions through a crystallization process using nickel silicide ($NiSi_x$) as a catalyst, patterning the polycrystalline silicon layer to form an active layer at the first region, leaving a nickel silicide residue at the second region, etching the nickel silicide residue with a solution including hydrofluoric acid (HF) and hydrogen peroxide ($H_2O_2$), forming a gate electrode over the active layer and forming a source and drain in the active layer.

In another embodiment, an etchant for nickel silicide ($NiSi_x$) includes: about 3% to about 10% by weight of hydrofluoric acid; and about 1% to about 5% by weight of hydrogen peroxide.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

In this example, hydrofluoric acid (HF) and hydrogen peroxide ($H_2O_2$) are used for cleaning. After a polycrystalline silicon layer crystallized through a low temperature crystallization method using nickel silicide as a crystallization catalyst is patterned to form an active layer, a nickel silicide residue remains on a buffer layer of silicon oxide ($SiO_x$). A solution including hydrofluoric acid (HF) and hydrogen peroxide ($H_2O_2$) may be used to eliminate the nickel silicide residue. Here, it is important to adjust concentrations of control hydrofluoric acid (HF) and hydrogen peroxide ($H_2O_2$) such that the solution does not cause damages to the active layer.

Figure 1A:
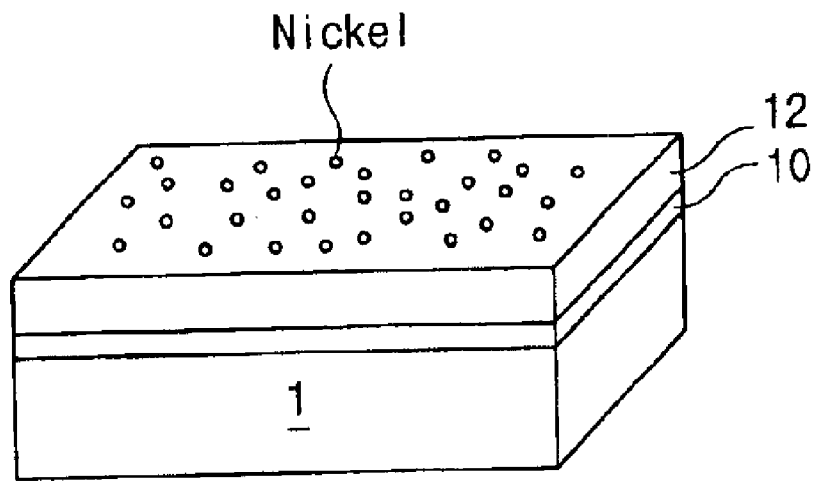
FIGS. 1A to 1C are schematic perspective views illustrating a related art low temperature crystallization process using nickel (Ni) as a catalyst metal.
Figure 1B:
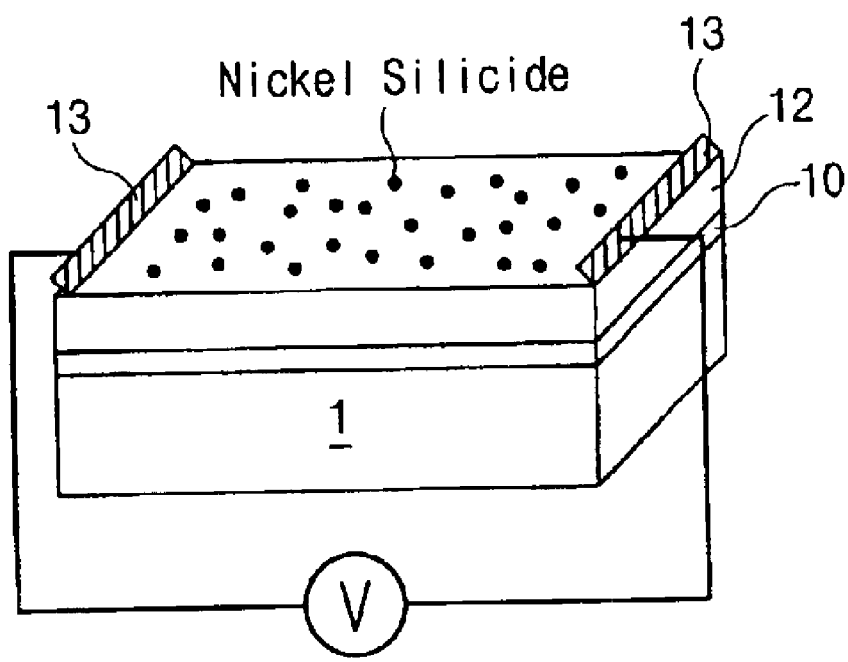
Figure 1C:
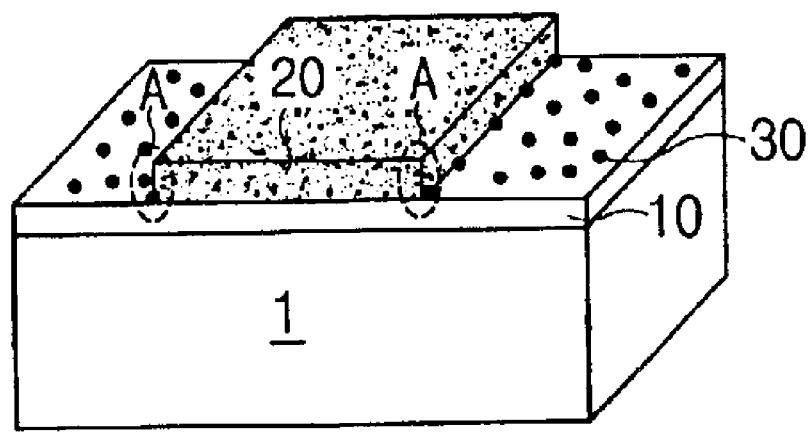
Figure 2A:
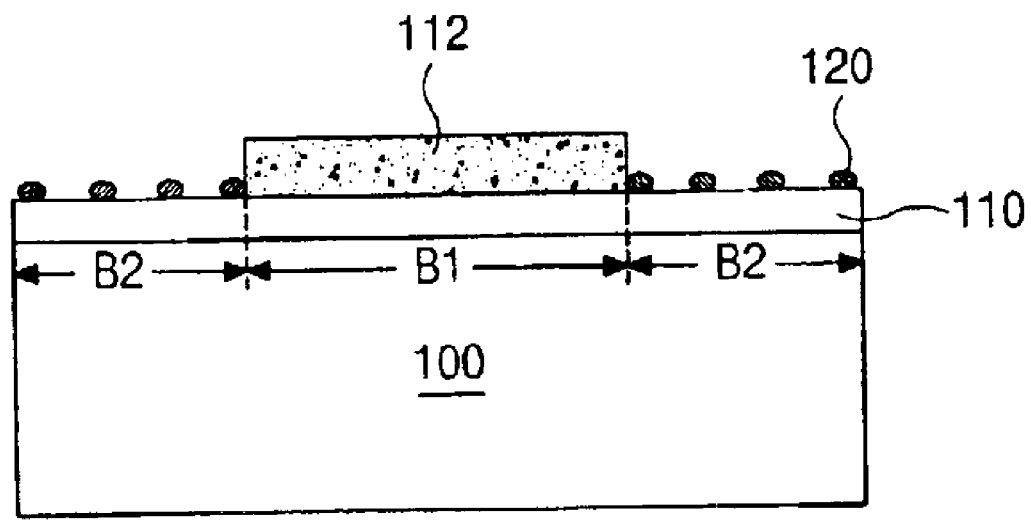
FIGS. 2A to 2C are schematic cross-sectional views illustrating a part of a fabrication process of a polycrystalline silicon thin film transistor according to an embodiment of the present invention.
Figure 2B:
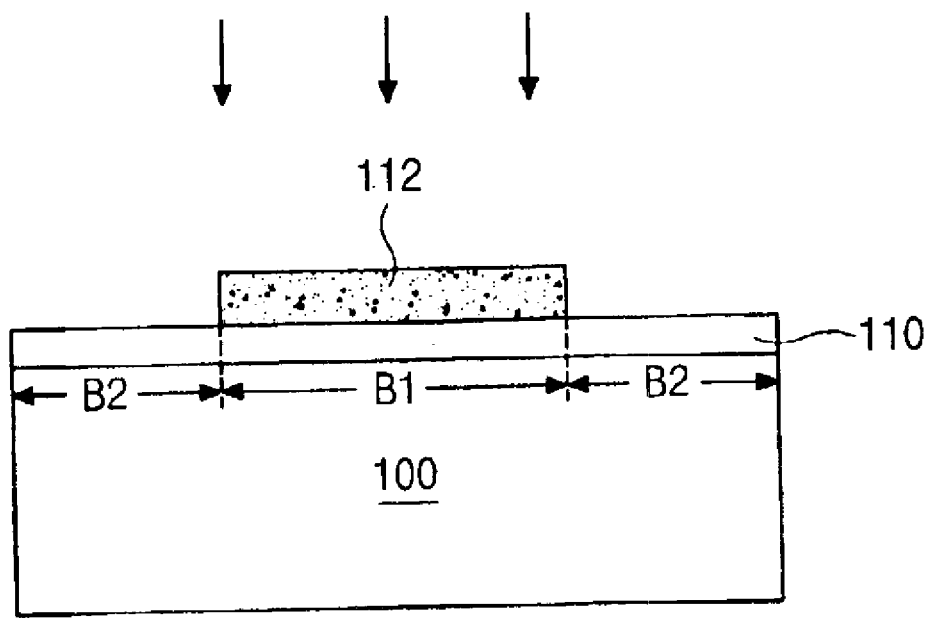
Figure 2C:
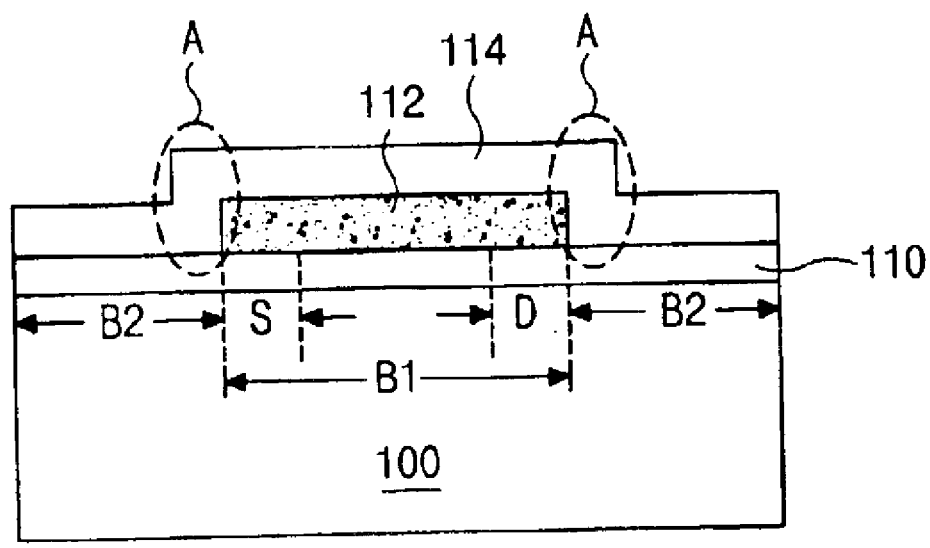

FIGS. 2A to 2C are schematic cross-sectional views illustrating a part of a fabricating process of a polycrystalline silicon thin film transistor according to an embodiment of the present invention.

In FIG. 2A, a buffer layer 110 is formed on a substrate 100 having first and second regions "B1" and "B2," and an active layer 112 is formed on the buffer layer 110 at the first region "B1" through a photolithographic process of patterning a polycrystalline silicon layer (not shown). The polycrystalline silicon layer is obtained through crystallizing an amorphous silicon layer (not shown) by using nickel silicide, for example, as a crystallization catalyst. For example, the amorphous silicon layer may be crystallized through a metal induced crystallization (MIC) method, a metal induced lateral crystallization (MILC) method or a field enhanced metal induced crystallization (FE-MIC) method. More specifically, after a photoresist (PR) pattern (not shown) is formed on the polycrystalline silicon layer by coating, exposure and development of photoresist (PR), the polycrystalline silicon layer is dry-etched by using the PR pattern as an etching mask, thereby forming the active layer 112. During the dry-etching step of the polycrystalline silicon layer, nickel silicide having a different structure from polycrystalline silicon is not etched completely and remains on the buffer layer 110 at the second region "B2" as a nickel silicide residue 120.

As shown in FIG. 2B, the nickel silicide residue 120 in the second region "B2" is etched with an etchant including hydrofluoric acid and hydrogen peroxide for about ten second. The etchant includes about 3% to about 10% by weight of hydrofluoric acid and about 1% to about 5% by weight of hydrogen peroxide. Preferably, the etchant includes about 5% by weight of hydrofluoric acid and about 3% by weight of hydrogen peroxide. By using the etchant, the nickel silicide residue 120 on the second region "B2" is effectively eliminated without causing damage to the active layer 112, as shown in FIG. 2B.

A gate insulating layer 114 is formed on the active layer 112, as shown in FIG. 2C. Since the nickel silicide residue 120 (of FIG. 2B) at the second region B2 is eliminated, a leakage current is prevented at source and drain regions "S" and "D" of the active layer 112. Further, step coverage property of the insulating layer 114 is improved at an edge portion "A" of the active layer 112.

Figure 3:
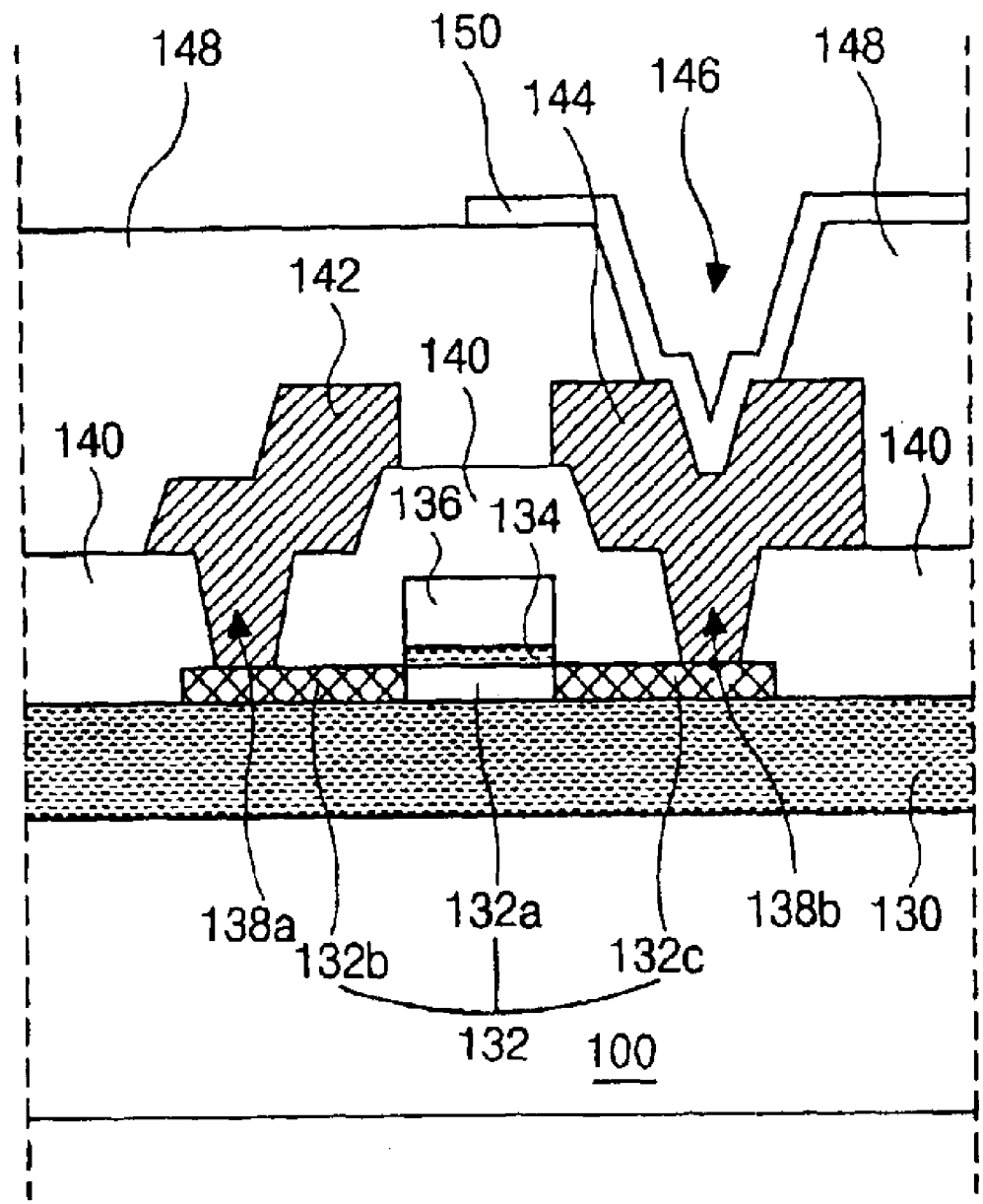
FIG. 3 is a cross-sectional view of a polycrystalline silicon thin film transistor according to an embodiment of the present invention.

FIG. 3 is a cross-sectional view of a polycrystalline silicon thin film transistor according to an embodiment of the present invention. Here, the polycrystalline silicon thin film transistor is a coplanar type TFT wherein a channel portion, and source and drain portions of an active layer are placed on the same plane.

As shown in FIG. 3, a buffer layer 130 is formed on a substrate 100 and an active layer 132 including a channel portion 132a and source and drain portions 132b and 132c are formed on the buffer layer 130. The active layer 132 is made of polycrystalline silicon obtained by crystallization process using nickel silicide, for example, as a crystallization catalyst, and the source and drain portions 132b and 132c are doped with impurities. A gate insulating layer 134 and a gate electrode 136 are sequentially formed on the channel portion 132a of the active layer 132. An interlayer insulating layer 140 having first and second contact holes 138a and 138b is formed on the gate electrode 136, and source and drain electrodes 142 and 144 are formed on the interlayer insulating layer 140. The source and drain electrodes 142 and 144 are connected to the source and drain portions 132b and 132c through the first and second contact holes 138a and 138b, respectively. A passivation layer 148 having a third contact hole 146 is formed on the source and drain electrodes 142 and 144, and a pixel electrode 150 connected to the drain electrode 144 through the third contact hole 146 is formed on the passivation layer 148. Here, after a nickel silicide residue from a patterning process of the active layer is eliminated, the polycrystalline silicon thin film transistor is fabricated. Accordingly, electrical characteristics and reliability of the polycrystalline thin film transistor are improved.

Since a nickel silicide residue is eliminated after a patterning process of an active layer, a leakage current can be prevented. Since step coverage is improved, process efficiency in terms of resolution and uniformity of coverage can be improved. Further, because a field enhanced metal induced crystallization (FE-MIC) method or other MIC techniques may be substituted for a conventional laser annealing method, capital investments in apparatuses can be reduced and prices competitiveness can be improved.

It will be apparent to those skilled in the art that various modifications and variations can be made in the organic electroluminescent display of the present invention without departing from the spirit or scope of the invention. Thus, it is intended that the present invention cover the modifications and variations of this invention provided they come within the scope of the appended claims and their equivalents.

What is claimed is:

1. A fabricating method of a polycrystalline silicon thin film transistor, comprising:

forming a polycrystalline silicon layer on a substrate having first and second regions through a crystallization process using nickel silicide ($NiSi_x$) as a catalyst;

patterning the polycrystalline silicon layer to form an active layer at the first region, leaving a nickel silicide residue at the second region;

etching the nickel silicide residue with a solution including hydrofluoric acid (HF) and hydrogen peroxide ($H_2O_2$), wherein the solution includes about 3% to about 10% by weight of hydroflouric acid and about 1% to about 5% by weight of hydrogen peroxide;

forming a gate electrode over the active layer; and forming a source and drain in the active layer.

2. The method according to claim 1, wherein the solution includes about 5% by weight of hydrofluoic acid and about 3% by weight of hydrogen peroxide.

3. The method according to claim 2, wherein etching the nickel silicide residue is performed for about 10 seconds.

4. The method according to claim 1, wherein patterning the polycrystalline silicon layer is performed through a photolithographic process including forming a photoresist (PR) pattern on the polycrystalline silicon layer and etching the polycrystalline silicon layer by using the photoresist (PR) pattern as an etching mask.

5. The method according to claim 4, wherein forming the photoresist (PR) pattern includes coating, exposure and development of a photoresist (PR).

6. The method according to claim 1, wherein forming a polycrystalline silicon layer is performed through a field enhanced metal induced crystallization (FE-MIC) method using a heat energy and an electric field.

\* \* \* \* \*